United States Patent
Ozturk et al.

(10) Patent No.: US 12,300,522 B2
(45) Date of Patent: May 13, 2025

(54) APPARATUS INCLUDING A SUBSTRATE CHUCK, A DISPENSER, AND A PLANARIZATION HEAD AND METHODS OF USING THE SAME

(71) Applicant: CANON KABUSHIKI KAISHA, Tokyo (JP)

(72) Inventors: Ozkan Ozturk, Round Rock, TX (US); Alireza Aghili, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 543 days.

(21) Appl. No.: 17/645,352

(22) Filed: Dec. 21, 2021

(65) Prior Publication Data

US 2023/0197463 A1    Jun. 22, 2023

(51) Int. Cl.
| | |
|---|---|
| *H01L 21/67* | (2006.01) |
| *H01L 21/02* | (2006.01) |
| *H01L 21/3105* | (2006.01) |

(52) U.S. Cl.
CPC .. *H01L 21/67155* (2013.01); *H01L 21/02345* (2013.01); *H01L 21/31051* (2013.01); *H01L 21/67092* (2013.01); *H01L 21/6715* (2013.01)

(58) Field of Classification Search
None
See application file for complete search history.

(56) References Cited

U.S. PATENT DOCUMENTS

| | | |
|---|---|---|
| 5,565,034 A | 10/1996 | Nanbu et al. |
| 6,532,198 B1 | 3/2003 | Miller |
| 8,973,495 B2 | 3/2015 | Kasumi et al. |
| 11,043,407 B2 | 6/2021 | Choi et al. |
| 2002/0110640 A1 | 8/2002 | Tateyama et al. |
| 2006/0130747 A1* | 6/2006 | Ishikawa ........... H01L 21/67184 118/52 |
| 2010/0012622 A1* | 1/2010 | Panga ................ G03F 7/70483 216/52 |
| 2020/0035512 A1* | 1/2020 | Reid ................... H05K 13/0469 |
| 2020/0333702 A1* | 10/2020 | Iwatani ............. H01L 21/67092 |
| 2021/0159075 A1 | 5/2021 | Choi |

OTHER PUBLICATIONS

International Search Report and Written Opinion for PCT Application No. PCT/US22/50528, dated Feb. 15, 2023, pp. 1-9.

* cited by examiner

*Primary Examiner* — Feifei Yeung Lopez
(74) *Attorney, Agent, or Firm* — Abel Schillinger, LLP

(57) ABSTRACT

An apparatus includes a first substrate chuck configured to hold a first substrate, a second substrate chuck configured to hold a second substrate, and a dispenser configured to dispense a formable material onto the first substrate while the first substrate overlies the first substrate chuck and to dispensing the formable material onto the second substrate while the second substrate overlies the second substrate chuck. A method of forming a planarization layer on a substrate can use the apparatus. A method of making an article can include the method of forming the planarization layer.

19 Claims, 8 Drawing Sheets

APPARATUS INCLUDING A SUBSTRATE CHUCK, A DISPENSER, AND A PLANARIZATION HEAD AND METHODS OF USING THE SAME

FIELD OF THE DISCLOSURE

The present disclosure relates to an apparatus, a method of using the same, and a method of making an article.

RELATED ART

Fluid deposition techniques are useful in fabricating electronic devices on semiconductor wafers. Such techniques can include the use of fluid dispense systems for depositing a formable material onto the wafer. A superstrate planarizes the dispensed material before the dispensed material is solidified on the wafer. Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed.

However, defects can arise as collimated light is deflected by the superstrate chuck prior to reaching the polymerizable material. As such, improvements in fluid processing techniques are desired to allow for whole wafer processing.

SUMMARY

In an aspect, an apparatus is disclosed. The apparatus comprises a first substrate chuck configured to hold a first substrate; a second substrate chuck configured to hold a second substrate; and a dispenser configured to dispense a formable material onto the first substrate while the first substrate overlies the first substrate chuck and to dispense the formable material onto the second substrate while the second substrate overlies the second substrate chuck.

In an embodiment, the apparatus further comprises a first planarization head configured to planarize the formable material on the first substrate while the first substrate overlies the first substrate chuck; and a second planarization head configured to planarize the formable material on the second substrate while the second substrate overlies the second substrate chuck.

In a particular embodiment, the apparatus further comprises a load station, wherein the dispenser is part of a dispensing station, and from a top view, the dispensing station is disposed between the loading station and the first planarization head.

In another particular embodiment, the dispenser is part of a dispensing station, and from a top view, the first planarization head is disposed between the loading station and the dispensing station.

In a further embodiment, the apparatus further comprising a dispenser conveyor coupled to the dispenser, wherein the first substrate chuck is configured to move along a first axis, the second substrate chuck is configured to move along a second axis, and the dispenser conveyor is configured to move the dispenser along a third axis that is different from each of the first axis and the second axis.

In another embodiment, the apparatus further comprises a first substrate stage coupled to the first substrate chuck, wherein the first substrate stage is configured to move the first substrate from a first substrate position to a second substrate position; and a second substrate stage coupled to the second substrate chuck, wherein the second substrate stage is configured to move the second substrate from a third substrate position to a fourth substrate position.

In a particular embodiment, the apparatus further comprises a dispenser conveyor coupled to the dispenser, wherein the first substrate stage is configured to move the first substrate chuck along a first axis, the second substrate stage is configured to move the second substrate chuck along a second axis, and the dispenser conveyor is configured to move the dispenser along a third axis that is different from each of the first axis and the second axis.

In a more particular embodiment, the third axis is within 1 degree of being orthogonal to the first axis or the second axis.

In another particular embodiment, the first substrate chuck is configured to move during dispensing, and the dispenser is configured to remain stationary during dispensing.

In a further particular embodiment, the first substrate chuck is configured to remain stationary during dispensing, and the dispenser is configured to move during dispensing.

In another embodiment, the dispenser has a length and a width, where the length is greater than the width, and the length is oriented along a fourth axis.

In a particular embodiment, the fourth axis is within 1 degree of being orthogonal to the first axis or the second axis.

In another particular embodiment, the fourth axis is within 1 degree of being parallel to the first axis or the second axis.

In a further embodiment, the dispenser comprises a plurality of dispensing heads.

In another embodiment, the apparatus further comprises a substrate conveyor configured to move the first substrate over the first substrate chuck and remove the first substrate from the first substrate chuck, and move the second substrate over the second substrate chuck and remove the second substrate from the second substrate chuck.

In another aspect, a method of forming a planarization layer is disclosed. The method comprises placing a first substrate on a first substrate chuck; dispensing a formable material onto the first substrate while the first substrate is over the first substrate chuck; contacting the formable material with a first superstrate while the formable material is on the first substrate, and the first substrate is over the first substrate chuck; curing the formable material over the first substrate to form a first planarization layer; placing a second substrate on a second substrate chuck; dispensing the formable material onto the second substrate while the second substrate is over the second substrate chuck; contacting the formable material with a second superstrate while the formable material is on the second substrate, and the second substrate is over the second substrate chuck; and curing the formable material over the second substrate to form a second planarization layer Dispensing the formable material onto the first substrate and dispensing the formable material onto the second substrate are performed using a same dispenser.

In an embodiment, the method further comprises moving the first substrate along a first axis from a first dispensing station to a first planarization station; moving the second substrate along a second axis from a second dispensing station to a second planarization station; and moving the dispenser along a third axis from the first dispensing station to the second dispensing station.

In a particular embodiment, the third axis is within 1 degree of being orthogonal to the first axis or the second axis.

In another embodiment, curing the formable material over the first substrate comprises exposing the formable material to an actinic radiation while the formable material is in contact with the first substrate and the first superstrate, and the first substrate is over the first substrate chuck. The method further comprises separating the first superstrate from the formable material after exposing the formable material to the actinic radiation.

In a further embodiment, during dispensing the formable material over the first substrate, the first substrate moves and the dispenser remains stationary, or the dispenser moves and the first substrate remains stationary.

In a further aspect, a method of making an article is disclosed. The method comprises forming the first planarization layer over the first substrate by using the method of claim 15; and processing the first substrate to complete formation of the article.

The method comprises placing a substrate on a substrate chuck; dispensing a formable material onto the substrate while the substrate is on the substrate chuck; contacting the formable material with a superstrate while the formable material is on the substrate, and the substrate is over the substrate chuck; and processing the substrate to complete formation of the article.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of in the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the arts.

An apparatus has a configuration that allows for higher throughput compared to conventional apparatuses. The apparatus is configured such that dispensing a formable material and contacting the formable material with a superstrate can be performed while the substrate is over a substrate chuck. Thus, a registration step is not required between the dispensing and planarization operations. The apparatus occupies a relatively smaller area as compared to conventional apparatuses. Thus, valuable manufacturing space can be used for other apparatuses or tools.

Figure 1:
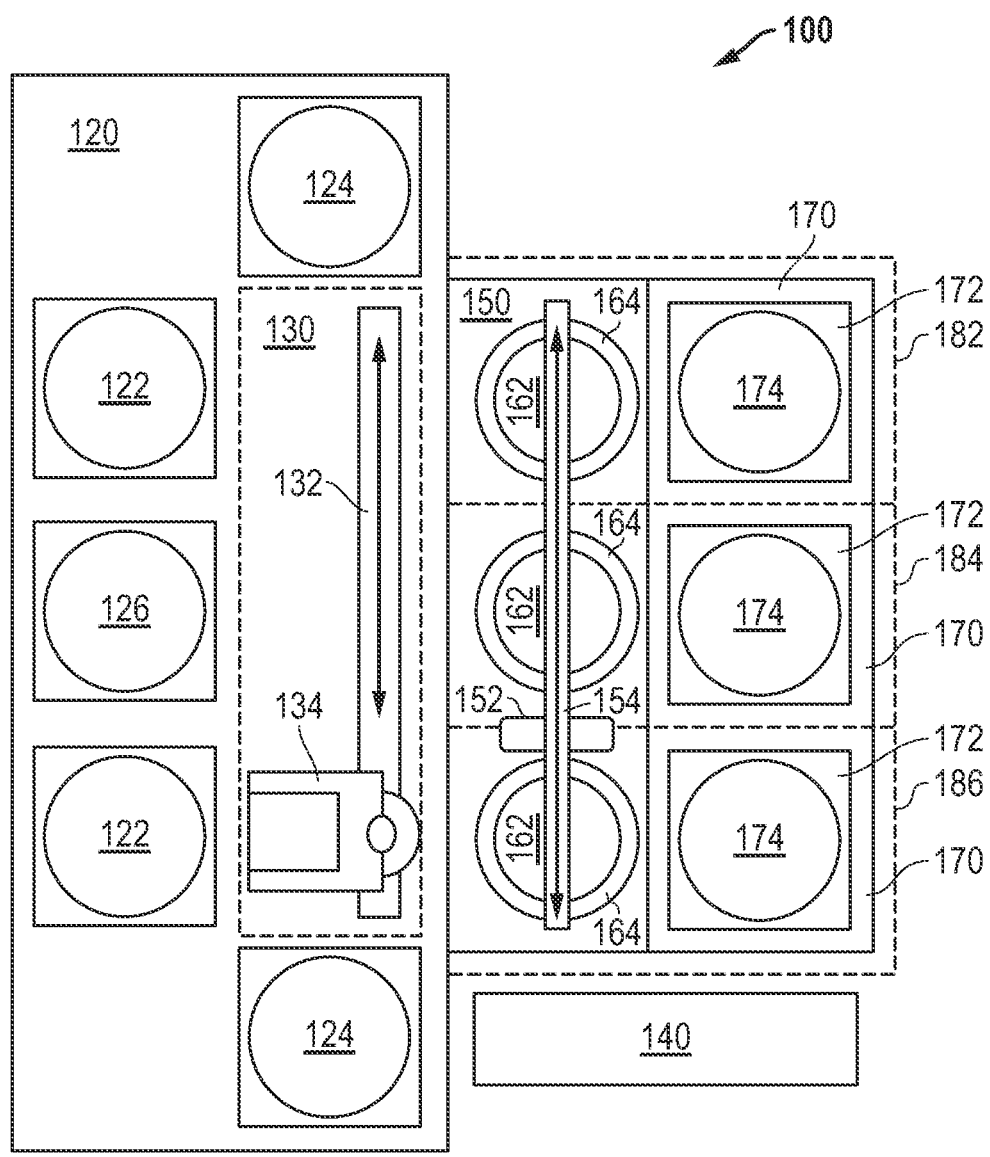
FIG. 1 includes an illustration of a top view of an apparatus in accordance with an embodiment.

FIG. 1 includes a top view of an apparatus 100 that can be used to form a planarization layer over a substrate. As illustrated, X and Y directions are along the surface of the drawing sheet and the Z direction is into and out of the drawing sheet.

As illustrated in FIG. 1, the apparatus 100 has an Equipment Front End Module (EFEM) 120, a dispensing station 150, and planarization stations 170.

The EFEM 120 includes substrate containers 122, each of which holds one or more substrates. More of fewer substrate containers 122 can be used with the EFEM 120. The substrate containers 122 can be a wafer cassette, or in a more particular embodiment, can be a Front Opening Universal Pod (FOUP).

The EFEM 120 further includes processing stations 124 that can be used before or after a planarization layer is formed over a substrate. The processing stations 124 can be configured to clean a substrate in place or along with heating or cooling a substrate. In an embodiment, the EFEM 120 includes a plurality of processing stations 124, where one of the processing stations 124 is configured to heat or cool a substrate, and another processing station 124 is configured to clean a substrate. Many other combinations of processing stations can be used. In any of the preceding embodiments, any particular processing station 124 can be configured to clean a substrate during one time period and heat or cool the same or another substrate during a different time period. For example, one of the processing stations 124 cleans a substrate before a formable material is formed over the substrate, and the other processing station 124 heats the substrate after the formable material has been exposed to actinic radiation to bake the formable material. The apparatus 100 can have more or fewer processing stations 124. The processing stations 124 are illustrated as being part of the apparatus 100. In another embodiment, one or both of the processing stations 124 may be part of a different apparatus. Skilled artisans will be able to determine whether the apparatus 100 has any processing stations 124, the number of processing stations 124, the functions provided by the processing stations 124, and the locations of processing stations 124 within the apparatus 100 in order to meet the needs or desires for a particular application.

The EFEM 120 includes an alignment station 126 that is configured to measure a position of a substrate. In an embodiment, the alignment station 126 can rotate the substrate and measure a notch (notch portion) along a peripheral edge of the substrate. This alignment will be used to locate the substrate on the chuck at the correct orientation. Registration is needed once the substrate is located on the chuck before dispensing. This registration helps ensure a formable material is dispensed at a proper areal density over the substrate and planarized to achieve a properly formed planarization layer.

The EFEM 120 includes a substrate conveying station 130 (illustrated with a dashed line) that is configured to move substrates within the EFEM 120 or from the EFEM 120 to substrate chucks 162 that can be located in the dispensing station 150 or any of the planarization stations 170. The substrate conveying station 130 includes a substrate conveyor 132 that moves a substrate in a translation direction (X-Y direction), a vertical direction (Z direction), and a rotation direction (Oz direction) by manipulating a substrate handler 134. In an embodiment, the substrate conveying station 130 can obtain the substrate from the alignment station 126 and place the substrate on one of the substrate chucks 162 by using the translation, vertical, or rotational motion or a combination of such motions.

Each of the substrate chucks 162 is coupled to a substrate stage 164 that is configured to allow its corresponding substrate chuck 162 to move between the dispensing station 150 and at least one of the planarization stations 170. In an embodiment, each substrate chuck 162 is associated with one of the planarization stations 170, and in another embodiment, the substrate chuck 162 may be used with at least two different planarization stations 170.

The EFEM 120 further includes a controller 140. The controller 140 controls the operation of the apparatus 100, including operations performed with the EFEM 120, the dispensing station 150, and the planarization stations 170. In another embodiment, the controller 140 may be located within or closer to the dispensing station 150 or the planarization stations 170. In another embodiment, more than one controller can be used. For example, each of the EFEM 120, the dispensing station 150, and the planarization stations 170 includes a controller. In the same or different embodiment of any one or more of the EFEM 120, the dispensing station 150, and the planarization stations 170 has more than one controller. In an embodiment, a controller can control each of or a combination of the processing station 124, the alignment station 126, or the substrate conveying station 130. In the same or another embodiment, within the dispensing station 150, one controller can control a dispenser 152, and a different controller can control a dispenser conveyor 154. After reading this specification, skilled artisans will appreciate that the location and number of controllers can be selected to meet the needs or desires for a particular application.

The dispensing station 150 includes the dispenser 152 and the dispenser conveyor 154. The dispenser 152 is configured to dispense a formable material onto a substrate. The dispenser 152 is coupled to a supply system (not illustrated) that supplies the formable material from a storage tank (not illustrated) to the discharge surface of the dispenser 152. The storage tank may be within the apparatus 100 or outside the apparatus 100. The supply system can include a pump that helps to keep stable the physical properties of the formable material, the wettability of the discharge surface of the dispenser, and pressure within the dispensing station 150. In an embodiment, the dispensing station 150 can be configured to apply the formable material by a spin coater or a slit coater. In another embodiment, the dispensing station 150 can be configured to apply the formable material using a liquid injection head, where the formable material is initially in a form of droplets or in the form of an island or film that coalesce to form a layer of the formable material. An ink-jet method can be used to dispense the formable material onto the substrate.

Each of the planarization stations 170 includes planarization head 172 and is configured to form exposed planarized surface of a layer of the formable material using a superstrate 174 within the planarization station 170. The superstrate 174 has a surface that is configured to contact the formable material during a planarization process. The superstrate 174 has a contacting surface that is unpatterned and is configured to contact the formable material. The superstrate 174 occupies an area that is the same or greater than an area occupied by the substrate. In the same or different embodiment, the planarization layer can be formed using as little as one exposure to actinic radiation.

The apparatus 100 includes lanes 182, 184, and 186 (illustrated with dashed lines) that include the planarization heads 172 and corresponding portions of the dispensing stations 150. The significance of the lanes is described later in this specification with respect to FIGS. 3 to 8.

Figure 2:
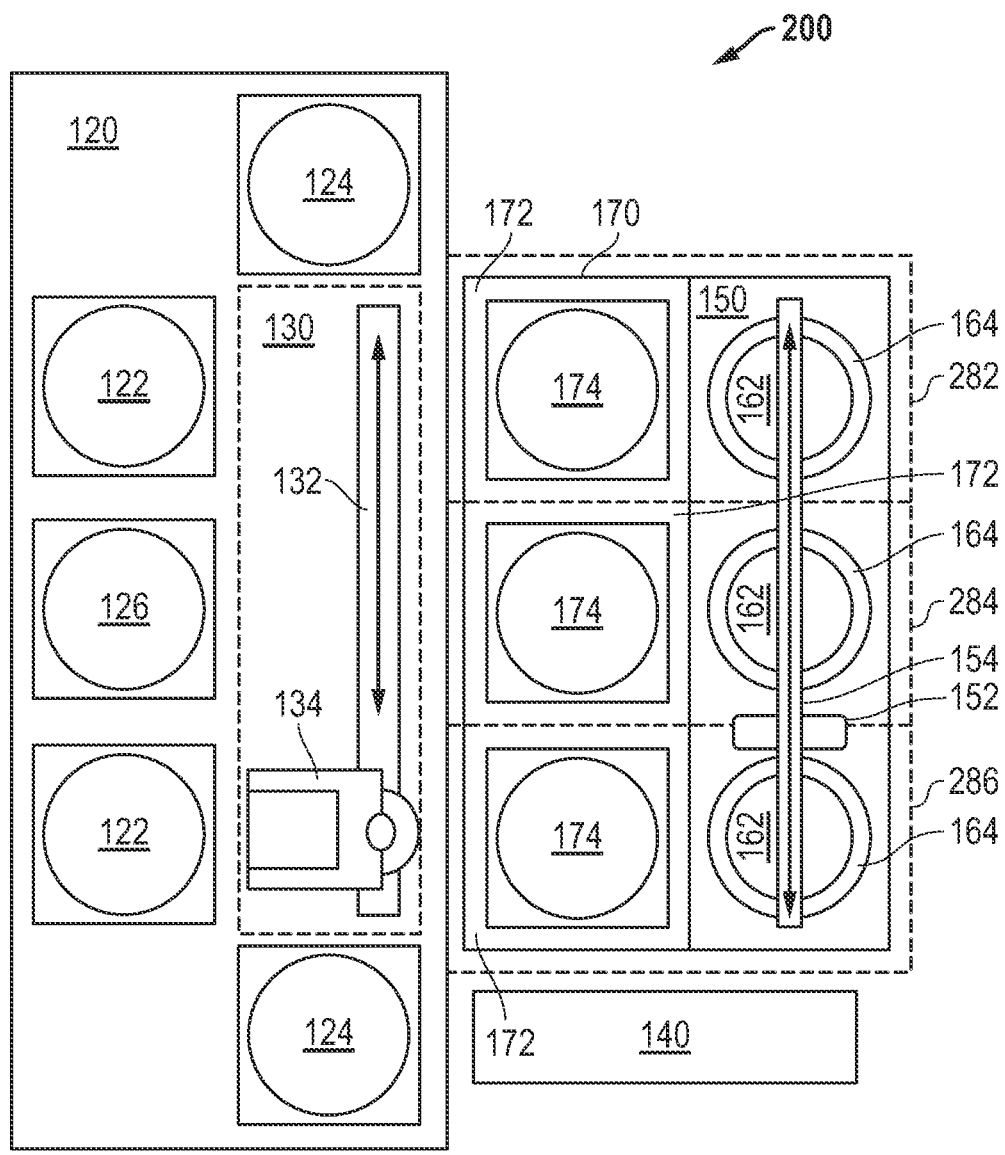
FIG. 2 includes an illustration of a top view of an apparatus in accordance with another embodiment.

In FIG. 1, the dispensing station 150 is disposed between the EFEM 120 and the planarization stations 170. In FIG. 2, an apparatus 200 has the planarization stations 170 disposed between the EFEM 120 and the dispensing station 150. Each apparatus has benefits. For example, the apparatus 100 may have a relatively less complex substrate conveying station 130. The apparatus 200 has lanes 282, 284, and 286 (illustrated with dashed lines). The dispensing station 150 is accessible more readily from one side of the apparatus 200, and such a design may allow for cleaning and maintenance of the dispensing station 150 to be relatively easier as compared to the apparatus 100.

The apparatuses described herein are intended for high volume manufacturing. Thus, the design of the apparatus may be affected by the time elapsed from (1) the time when a substrate is removed from a substrate container 122 to (2) the time when the substrate having the planarization layer is returned to the same or different substrate container 122. One or more other considerations can also affect the design of the apparatus. The designs of the apparatuses 100 and 200 are illustrative and not intended to limit the invention as defined in the appended claims. Skilled artisans will be able to determine a design for the apparatus to achieve the needs or desires for a particular application.

Figure 3:
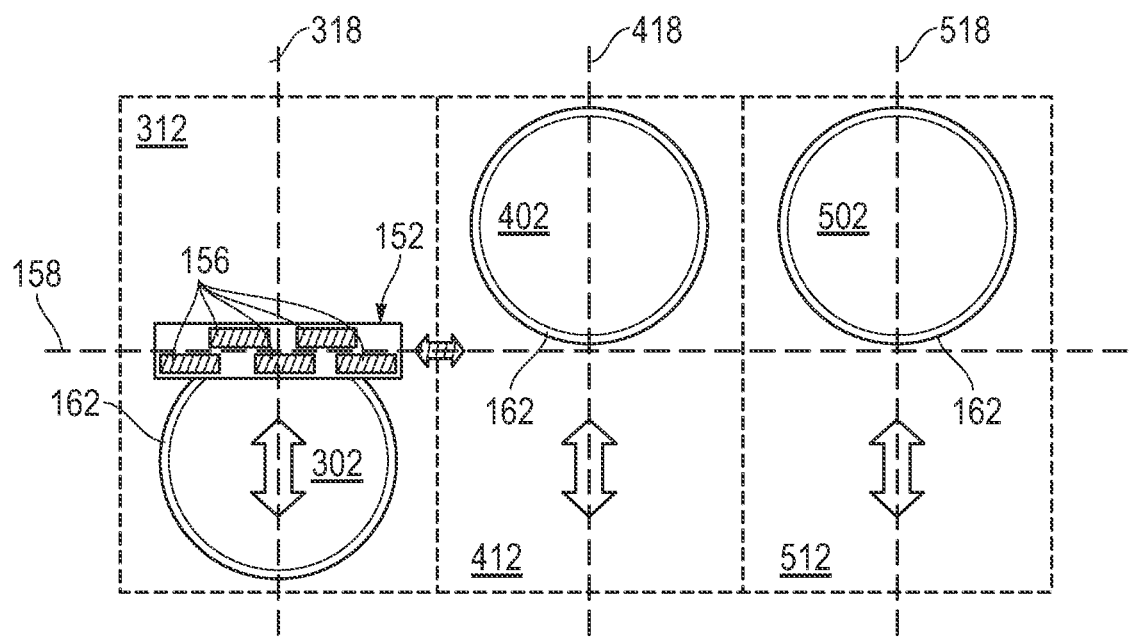
FIG. 3 includes a top view of lanes that include a substrate, a substrate chuck, and a dispenser.
Figure 4:
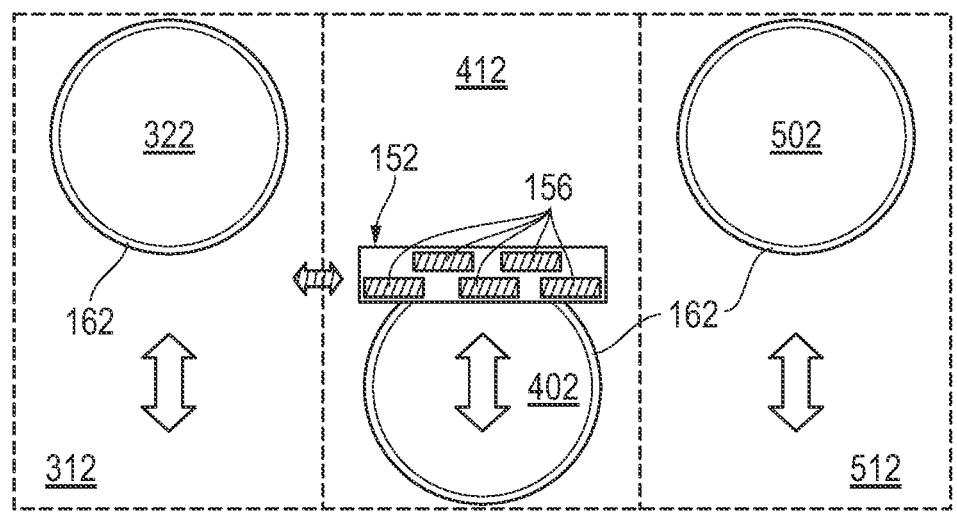
FIG. 4 includes a top view of lanes that include a substrate, a substrate chuck, and a dispenser.
Figure 5:
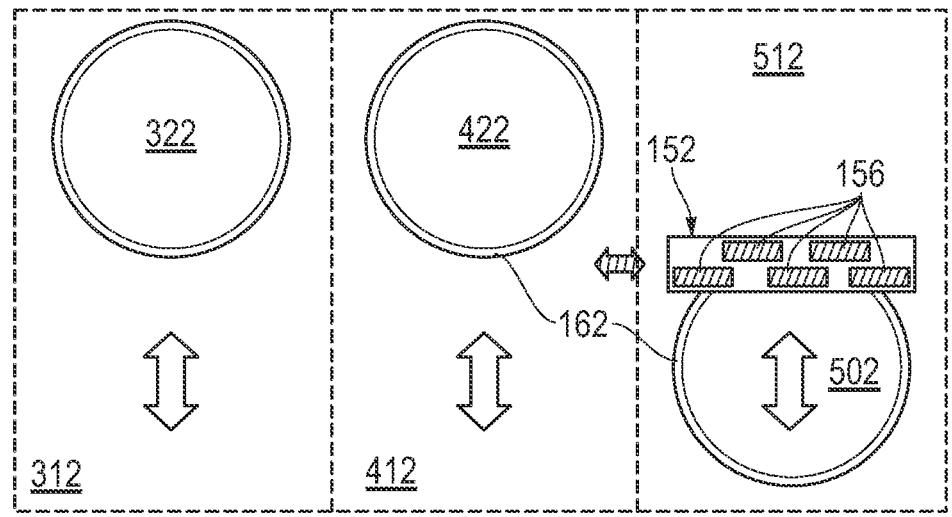
FIG. 5 includes a top view of lanes that include a substrate, a substrate chuck, and a dispenser.
Figure 6:
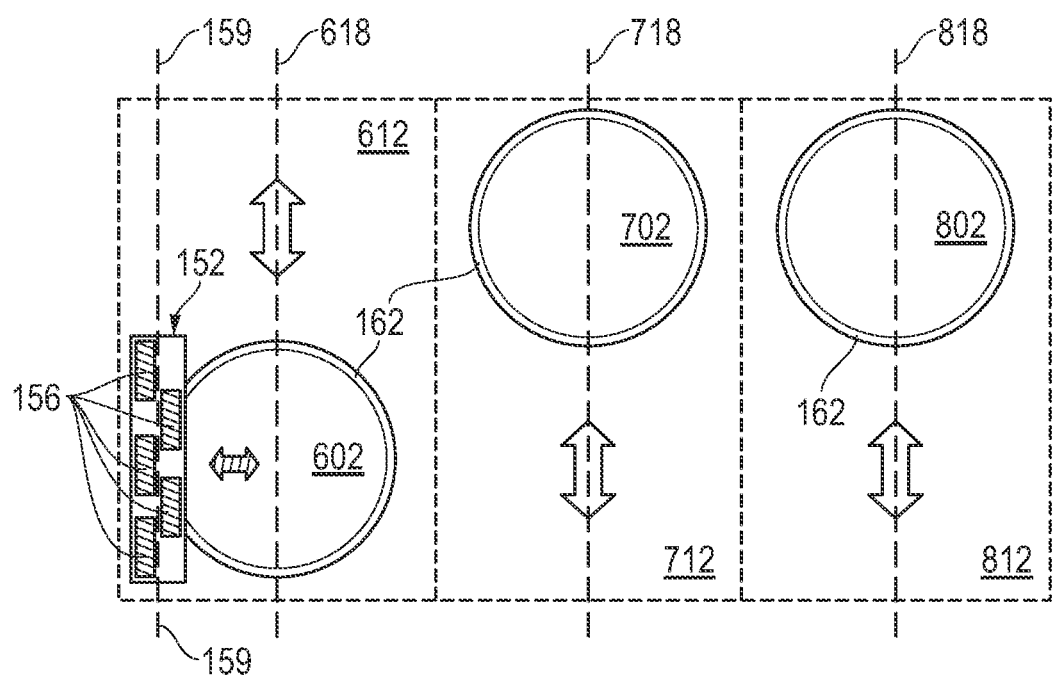
FIG. 6 includes a top view of lanes that include a substrate, a substrate chuck, and a dispenser.
Figure 7:
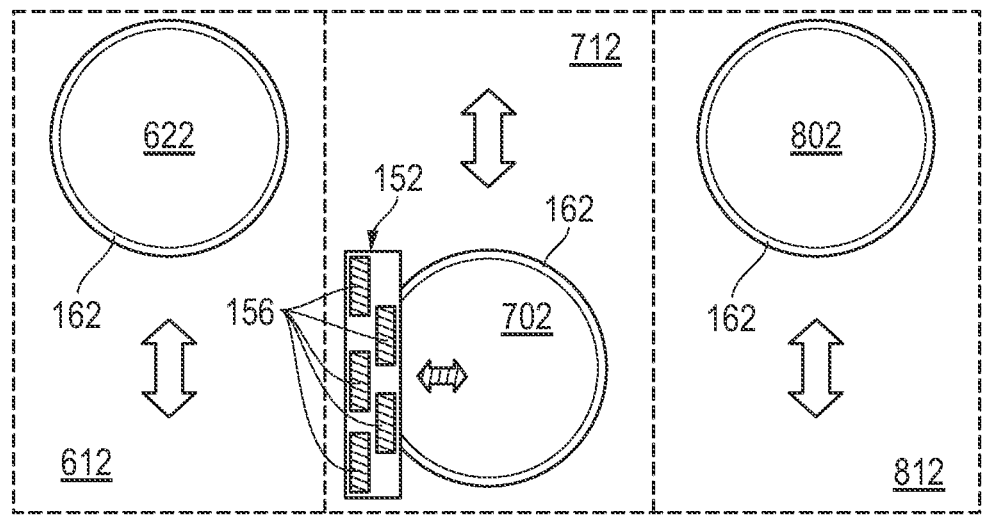
FIG. 7 includes a top view of lanes that include a substrate, a substrate chuck, and a dispenser.
Figure 8:
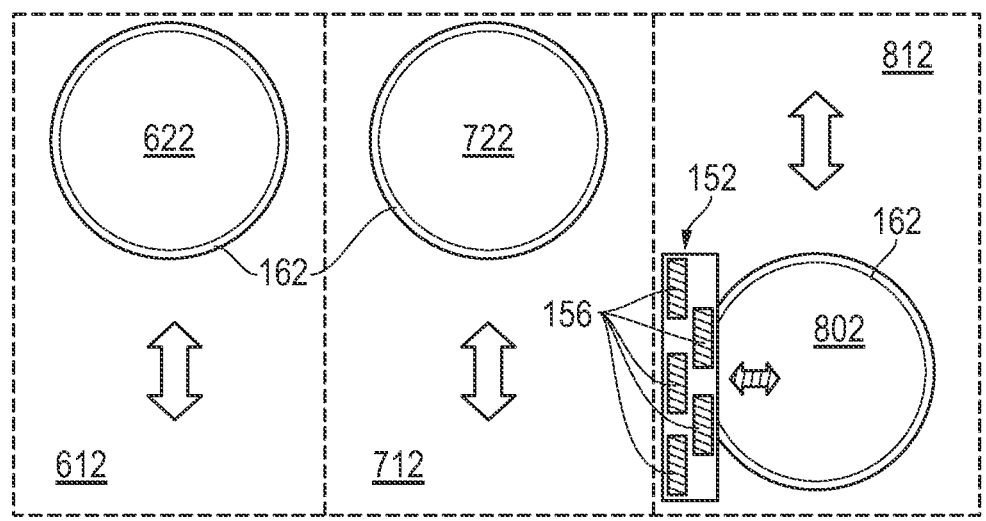
FIG. 8 includes a top view of lanes that include a substrate, a substrate chuck, and a dispenser.

Dispensing and planarization operations are described with respect to lanes as illustrated in FIGS. 3 to 5 for one configuration and FIGS. 6 to 8 for another configuration. FIGS. 3 to 5 illustrate an embodiment in which the dispenser 152 remains stationary while the substrate chuck 162 moves during a dispensing operation. FIGS. 6 to 8 illustrate an embodiment in which the dispenser 152 moves while the substrate chuck 162 remains stationary during a dispensing operation.

The controller 140, the dispenser conveyor 154, the substrate stages 164, the planarization heads 172, and the superstrates 174 are not illustrated in FIGS. 3 to 8 to simplify understanding of processing within the lanes, although such components are referenced below and are present within the apparatus.

In the illustrated embodiment in FIGS. 3 to 8, the dispenser 152 includes a plurality of dispensing heads 156. The formable material can be dispensed from the dispensing heads 156 onto a substrate when the substrate is over the substrate chuck 162. In FIGS. 3 to 8, the substrate stages and substrate chucks 162 are configured to move from positions for the dispensing operations to positions for the planarization operations, and such motion is illustrated by the double-headed arrows within each lane that point toward the top and bottom of FIGS. 3 to 8. The dispenser conveyor 154 is configured to move the dispenser 152 from a position in one lane to a position in another lane, and such motion is illustrated by the double-headed arrows that point toward the left-hand and right-hand sides of FIGS. 3 to 8. Thus, the dispenser 152 is configured to move in a direction that is orthogonal to the direction that the substrates and the substrate chucks 162 move.

In FIG. 3, the dispenser 152 is positioned within a lane 312. From a top view, the dispenser 152 has a length and a width, where the length is greater than the width. The length of the dispenser is oriented along an axis 158. Within lane 312, a substrate stage 164 is configured to move the substrate chuck 162 along an axis 318, within lane 412, a substrate stage 164 is configured to move the substrate chuck 162 along an axis 418, and within lane 512, a substrate stage 164 is configured to move the substrate chuck 162 along an axis 518. Ideally, the axes 318, 418, and 518 are parallel to one another and are orthogonal to the axis 158. Due to manufacturing tolerances, the axes 318, 418, and 518 can be within 1 degree of being parallel to one another and can be within 1 degree of being orthogonal to the axis 158. As used herein, "within 1 degree" is meant to be +/−1 degree and, with respect to parallel, includes no intersection of at least two axes (effectively, 0 degrees) and, with respect to orthogonal, includes an intersection of any two axis at an angle in a range from 89 degrees to 91 degrees, which includes 90 degrees within such range.

Before a dispensing operation begins, if needed, the substrate 302, the substrate chuck 162, and substrate stage 164 within the lane 312 can move from a location closer to the top of FIG. 3 to another location closer to the bottom of FIG. 3. During a dispensing operation within the lane 312, the substrate stage 164 moves the substrate chuck 162, and a substrate 302 under the dispenser 152 while the dispenser 152 remains stationary. Formable material is dispensed onto the exposed surface of the substrate 302. In an embodiment, the substrate 302 has an exposed surface having one or more projections within a local area that lies at a relative higher elevation as compared to another local area that has one or more recessions along the exposed surface. The controller 140 can instruct or provide signals to the dispensing station 150 to dispense a lower areal density of formable material for the local area lying at the relatively higher elevation as compared to the other local area.

After the formable material is dispensed on the substrate 302, the substrate stage 164 continues to move the substrate 302 and the substrate chuck 162 to a position where the planarization operation is performed, which is closer to the top of FIG. 3. Planarizing of the formable material can be performed by the planarization head 172 and the superstrate 174 in the lane 312, where the planarization operation is performed within lane 312 at a position closer to the top of FIG. 3. After the planarization operation is completed, the substrate 302 is removed, and a substrate 322 is placed on the substrate chuck 162 as illustrated in FIG. 4.

Referring to FIGS. 3 and 4, the dispenser conveyor moves the dispenser 152 from a position within the lane 312 to a position within a lane 412. Before a dispensing operation begins, if needed, the substrate 402, a substrate chuck 162, and a substrate stage 164 within the lane 412 can move from a location closer to the top of FIG. 4 to another location closer to the bottom of FIG. 4. During a dispensing operation within the lane 412, the substrate stage 164 moves the substrate chuck 162, and a substrate 402 under the dispenser 152 while the dispenser 152 remains stationary. Formable material is dispensed onto the exposed surface of the substrate 402. In an embodiment, the substrate 402 has an exposed surface having one or more projections within a local area that lies at a relative higher elevation as compared to another local area that has one or more recessions along the exposed surface. The controller 140 can instruct or provide signals to the dispensing station 150 to dispense a lower areal density of formable material for the local area lying at the relatively higher elevation as compared to the other local area.

After the formable material is dispensed on the substrate 402, the substrate stage 164 continues to move the substrate 402 and the substrate chuck 162 to a position where the planarization operation is performed, which closer to the top of FIG. 4. Planarizing of the formable material can be performed by the planarization head 172 and the superstrate 174 in the lane 412, where the planarization operation is performed within lane 412 at a position closer to the top of FIG. 4. The planarization can be performed to form a planarization layer as described later in this specification. After the planarization operation is completed, the substrate 402 is removed, and a substrate 422 is placed on the substrate chuck 162 as illustrated in FIG. 5.

Referring to FIGS. 4 and 5, the dispenser conveyor moves the dispenser 152 from a position within the lane 412 to a position within a lane 512. Before a dispensing operation begins, if needed, the substrate 502, a substrate chuck 162, and a substrate stage 164 within the lane 512 can move from a location closer to the top of FIG. 5 to another location closer to the bottom of FIG. 5. During a dispensing operation within the lane 512, the substrate stage 164 moves the substrate chuck 162, and a substrate 502 under the dispenser 152 while the dispenser 152 remains stationary. Formable material is dispensed onto the exposed surface of the substrate 502. In an embodiment, the substrate 502 has an exposed surface having one or more projections within a local area that lies at a relative higher elevation as compared to another local area that has one or more recessions along the exposed surface. The controller 140 can instruct or provide signals to the dispensing station 150 to dispense a lower areal density of formable material for the local area lying at the relatively higher elevation as compared to the other local area.

After the formable material is dispensed on the substrate 502, the substrate stage 164 continues to move the substrate 502 and the substrate chuck 162 to a position where the planarization operation is performed, which closer to the top of FIG. 5. Planarizing of the formable material can be performed by the planarization head 172 and the superstrate 174 in the lane 512, where the planarization operation is performed within lane 512 at a position closer to the top of FIG. 5. The planarization can be performed to form a planarization layer as described later in this specification. After the planarization operation is completed, the substrate 502 is removed, and another substrate (not illustrated in FIG. 5) is placed on the substrate chuck 162.

In FIG. 6, the dispenser 152 is positioned within a lane 612. From a top view, the dispenser 152 has a length and a width, where the length is greater than the width. The length of the dispenser is oriented along an axis 159. Within lane 612, a substrate stage 164 is configured to move the substrate chuck 162 along an axis 618, within lane 712, a substrate stage 164 is configured to move the substrate chuck 162 along an axis 718, and, within lane 812, a substrate stage 164 is configured to move the substrate chuck 162 along an axis 818. Ideally, the axes 618, 718, and 818 are parallel to one another and are orthogonal to the axis 159. Due to manufacturing tolerances, the axes 159, 618, 718, and 818 can be within 1 degree of being parallel to one another.

Before a dispensing operation begins, if needed, the substrate 602, the substrate chuck 162, and substrate stage 164 within the lane 612 can move from a location closer to the top of FIG. 6 to another location closer to the bottom of FIG. 6. During a dispensing operation within the lane 612, the dispenser conveyor moves the dispenser 152 over the substrate 602 while the substrate stage 164, the substrate chuck 162, and a substrate 602 remain stationary. Formable material is dispensed onto the exposed surface of the substrate 602. In an embodiment, the substrate 602 has an exposed surface having one or more projections within a local area that lies at a relative higher elevation as compared to another local area that has one or more recessions along the exposed surface. The controller 140 can instruct or provide signals to the dispensing station 150 to dispense a lower areal density of formable material for the local area lying at the relatively higher elevation as compared to the other local area.

After the formable material is dispensed on the substrate 602, the substrate stage 164 moves the substrate 602 and the substrate chuck 162 to a position where the planarization operation is performed, which closer to the top of FIG. 6. Planarizing of the formable material can be performed by the planarization head 172 and the superstrate 174 in the lane 612, where the planarization operation is performed within lane 612 at a position closer to the top of FIG. 6. The planarization can be performed to form a planarization layer as described later in this specification. After the planarization operation is completed, the substrate 602 is removed, and a substrate 622 is placed on the substrate chuck 162 as illustrated in FIG. 7.

Referring to FIGS. 6 and 7, the dispenser conveyor moves the dispenser 152 from a position within the lane 612 to a position within a lane 712. Before a dispensing operation begins, if needed, the substrate 702, a substrate chuck 162, and a substrate stage 164 within the lane 712 can move from a location closer to the top of FIG. 7 to another location closer to the bottom of FIG. 7. During a dispensing operation within the lane 712, the dispenser conveyor 154 moves the dispenser 152 over the substrate 702 while the substrate stage 164, the substrate chuck 162, and a substrate 702 remain stationary. Formable material is dispensed onto the exposed surface of the substrate 702. In an embodiment, the substrate 702 has an exposed surface having one or more projections within a local area that lies at a relative higher elevation as compared to another local area that has one or more recessions along the exposed surface. The controller 140 can instruct or provide signals to the dispensing station 150 to dispense a lower areal density of formable material for the local area lying at the relatively higher elevation as compared to the other local area.

After the formable material is dispensed on the substrate 702, the substrate stage 164 moves the substrate 702 and the substrate chuck 162 to a position where the planarization operation is performed, which closer to the top of FIG. 7. Planarizing of the formable material can be performed by the planarization head 172 and the superstrate 174 in the lane 712, where the planarization operation is performed within lane 712 at a position closer to the top of FIG. 7. The planarization can be performed to form a planarization layer as described later in this specification. After the planarization operation is completed, the substrate 702 is removed, and a substrate 722 is placed on the substrate chuck 162 as illustrated in FIG. 8.

Referring to FIGS. 7 and 8, the dispenser conveyor moves the dispenser 152 from a position within the lane 712 to a position within a lane 812. Before a dispensing operation begins, if needed, the substrate 802, a substrate chuck 162, and a substrate stage 164 within the lane 812 can move from a location closer to the top of FIG. 8 to another location closer to the bottom of FIG. 8. During a dispensing operation within the lane 812, the dispenser conveyor 154 moves the dispenser 152 over the substrate 802 while the substrate stage 164, the substrate chuck 162, and a substrate 802 remain stationary. Formable material is dispensed onto the exposed surface of the substrate 802. In an embodiment, the substrate 802 has an exposed surface having one or more projections within a local area that lies at a relative higher elevation as compared to another local area that has one or more recessions along the exposed surface. The controller 140 can instruct or provide signals to the dispensing station 150 to dispense a lower areal density of formable material for the local area lying at the relatively higher elevation as compared to the other local area.

After the formable material is dispensed on the substrate 802, the substrate stage 164 moves the substrate 802 and the substrate chuck 162 to a position where the planarization operation is performed, which closer to the top of FIG. 8. Planarizing of the formable material can be performed by the planarization head 172 and the superstrate 174 in the lane 812, where the planarization operation is performed within lane 812 at a position closer to the top of FIG. 8. The planarization can be performed to form a planarization layer as described later in this specification. After the planarization operation is completed, the substrate 802 is removed, and another substrate (not illustrated in FIG. 8) is placed on the substrate chuck 162.

In FIGS. 3 to 8, substrates are illustrated on all substrate chucks. In practice, when dispensing the formable material onto a particular substrate within a particular lane, substrates may or may not be on the substrate chucks 162 in other lanes. The movement and processing of the substrates can be performed in order to have the highest sustainable equipment throughput to achieve high volume manufacturing. In a further embodiment, each lane can have its own dispenser, so that each lane can be operated independently of the other lanes. Skilled artisans will be able to evaluate equipment complexity and its impact on equipment throughput and design the apparatus to achieve the needs or desires for a particular application.

The benefits of the apparatus become more apparent when considered with respect to planarization operations.

Figure 9:
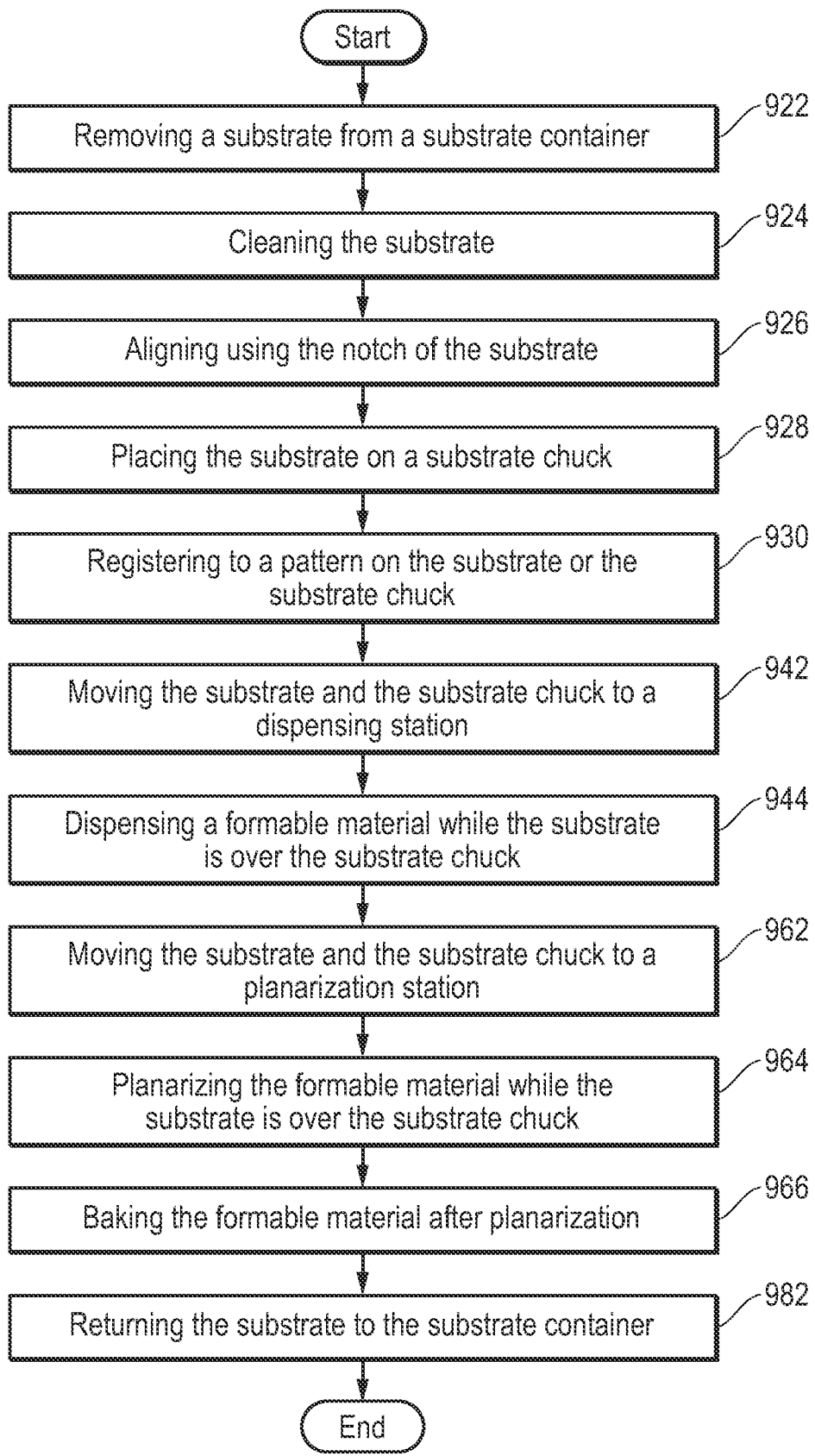
FIG. 9 includes flow diagram for a method of making an article using an apparatus in accordance with an embodiment.

FIG. 9 includes a flow diagram of a process that can be used with any of the apparatuses described herein. The process in FIG. 9 is described with respect to the apparatus 200 illustrated in FIG. 2 and the dispensing and planarization configuration of FIG. 3. The process is also applicable to the apparatus 100 in FIG. 1 and the dispensing and planarization configuration in FIGS. 4 to 8.

The process includes removing a substrate from a substrate container at block 922 in FIG. 9. The substrate 302 can be a glass, a ceramic, a metal, a semiconductor, a resin, or the like. In a particular embodiment, the substrate 302 includes a silicon wafer, a compound semiconductor wafer, silica glass, or the like. Referring to FIGS. 2 and 3, the substrate conveyor 132 moves the substrate handler 134 to the substrate container 122 and removes the substrate 302 from the substrate container 122.

The process further includes cleaning the substrate at block 924. The cleaning operation is optional as the substrate 302 may be sufficiently clean. The substrate conveyor 132 moves the substrate handler 134 with the substrate 302 to the processing station 124, provided that the processing station 124 is configured to clean substrates. Cleaning is performed while the substrate 302 is within the processing station 124. In another embodiment, a cleaning operation can be performed before the substrate container 122 with the substrate 302 is placed into the apparatus 200. In this embodiment, the cleaning operation is performed before removing the substrate in block 922 of FIG. 9 if a cleaning operation is performed.

The process includes aligning using a notch of the substrate at block 926. The substrate conveyor 132 moves the substrate handler 134 with the substrate 302 to the alignment station 126. The alignment station 126 rotates the substrate 302 and measures a notch (notch portion) along a peripheral edge of the substrate 302. This alignment allows for proper dispensing and planarization operations described later in the process. The alignment helps ensure a formable material is dispensed at a proper areal density over the substrate and planarized to achieve a properly formed planarization layer.

The process includes placing the substrate on a substrate chuck at block 928 and registering to a pattern on the substrate or the substrate chuck at block 930. Referring to FIGS. 2 and 3, the substrate conveyor 132 of the substrate conveying station 130 moves the substrate handler 134 with the substrate 302 from the alignment station 126 to the substrate chuck 162 in the lane 312. Within the lane 312, the substrate stage 164 is configured to move the substrate chuck 162 and the substrate 302 from the planarization head 172 to a corresponding portion within the dispensing station 150. When the substrate 302 is placed on the substrate chuck 162, the substrate chuck 162 and the substrate stage 164 are near the top of FIG. 3.

The process further includes moving the substrate and the substrate chuck to the dispensing station at block 942 in FIG. 9. The substrate stage 164 moves the substrate 302 and substrate chuck 162 to the dispensing station 150 if the substrate stage 164 is not already within the dispensing station 150. Referring to FIG. 2, planarization station 170 is disposed between the EFEM 120 and the dispensing station 150. In this embodiment, the substrate stage 164 moves the substrate chuck 162 and the substrate 302 to a position near the bottom of FIG. 3 if the substrate chuck 162 and the substrate 302 are not in the proper position for the dispensing operation.

Figure 10:
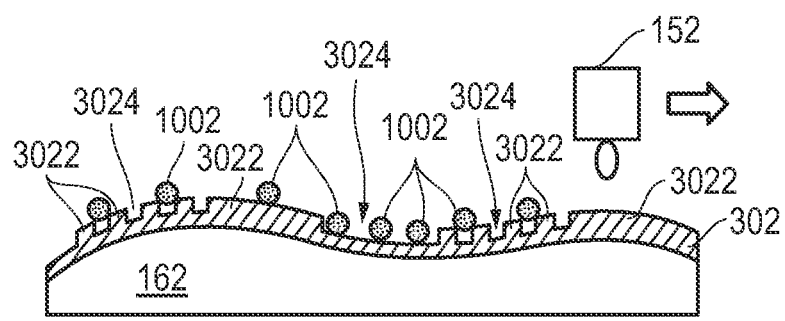
FIG. 10 includes an illustration of a cross-sectional view of a portion of a workpiece during a dispensing operation for a formable material.

The process includes dispensing a formable material while the substrate is over the substrate chuck at block 944 in FIG. 9. Referring to FIGS. 2, 3, and 10, the substrate stage 164 moves under the dispenser 152 as the formable material 1002 is dispensed onto the substrate 302.

The formable material 1002 can be cured by curing energy. The manufacturer of the formable material 1002 provides information on the particular type of energy that is to be used with the formable material 1002. The curing energy can include heat or actinic radiation having a wavelength in a range from 10 nm to 1000 nm. In an embodiment, actinic radiation can be ultraviolet light, visible light, or infrared radiation. In the same or different embodiment, the formable material 1002 includes a polymerizable compound and a photopolymerization initiator. The formable material 1002 may or may not include a non-polymerizable compound or a solvent. The non-polymerizable compound can include a sensitizer, a hydrogen donor, an internal mold release agent, a surfactant, an antioxidant, or a combination thereof.

Along the exposed surface of the substrate 302 are protrusions 3022 and recessions 3024. A lower areal density of the formable material 1002 is dispensed where protrusions 3022 occupy a relatively larger fraction of a local area, and a higher areal density of the formable material 1002 is dispensed where recessions 3024 occupy a relatively larger fraction of a different local area. In practice, the exposed surface of the substrate 302 is significantly more complex than illustrated in FIG. 10 and is not limited to only two elevations. The exposed surface of the substrate 302 in FIG. 10 is simplified to aid in understanding the concepts described herein.

As illustrated in FIG. 3, the dispenser 152 is stationary as the substrate stage 164 moves the substrate chuck 162 and substrate 302 during dispensing onto the substrate 302. In another embodiment, such as illustrated in FIG. 6, the substrate stage 164 is stationary as the dispenser conveyor 154 moves the dispenser 152 when dispensing the formable material onto the substrate 302.

The process further includes moving the substrate and the substrate chuck to a planarization station at block 962 in FIG. 9. Referring to FIG. 3, the substrate stage 164 moves the substrate chuck 162 and the substrate 302 to a position near the bottom of FIG. 3. Referring to FIGS. 2 and 3, the movement continues until the substrate 302 and the substrate chuck 162 is in a proper position for planarizing that is under the planarization head 172. If needed or desired, the dispenser 152 can be moved to a different lane, such as the lane 412 or 512 before, during, or after the substrate stage 164 completes moving the substrate chuck 162 and the substrate 302 to a planarization section in lane 312.

Figure 11:
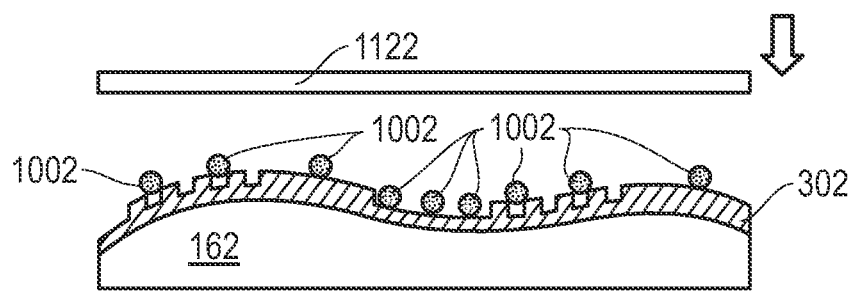
FIG. 11 includes an illustration of a cross-sectional view of the workpiece of FIG. 10 during a planarization operation using a superstrate.

The process includes planarizing the formable material while the substrate is over the substrate chuck at block 964 in FIG. 9. Referring to FIG. 11, a superstrate 1122 is lowered until it contacts the formable material 1002. The superstrate 1122 causes the formable material 1002 to flow along the exposed surface of the substrate 302.

A registration operation is not required between dispensing the formable material and planarizing the formable material 1002 because the substrate 302 remains over the substrate chuck 162 during the dispensing and planarization operations. Thus, higher throughput and higher yield (due to at least in part to less substrate handling) can be achieved with the apparatus 200 in FIG. 2, and also with the apparatus 100 in FIG. 1.

Figure 12:
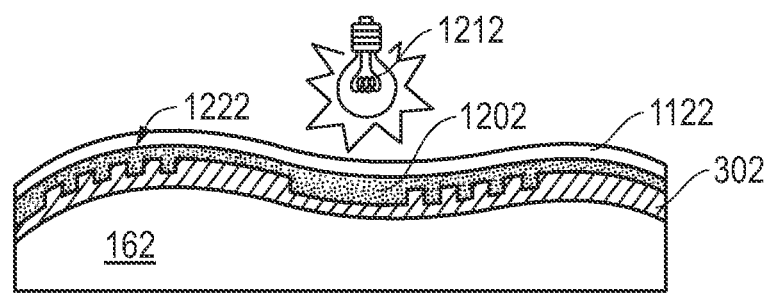
FIG. 12 includes an illustration of a cross-sectional view of the workpiece of FIG. 11 during exposure of the formable material to actinic radiation.
Figure 13:
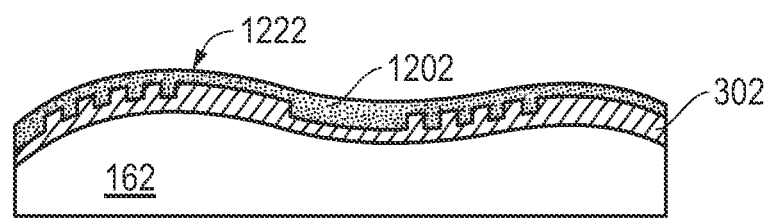
FIG. 13 includes an illustration of a cross-sectional view of the workpiece of FIG. 12 after the superstrate is removed.

After the superstrate 1122 reaches its desired position, actinic radiation 1212 is used to expose the formable material to polymerize the formable material to form a planarization layer 1202 that has an upper surface 1222 as illustrated in FIG. 12. In the embodiment illustrated in FIG. 13, the superstrate 1122 is removed.

The process further includes baking the formable material after planarizing at block 966 in FIG. 9. The substrate conveyor 132 manipulates the substrate handler 134 of the substrate conveying station 130 to move the substrate 302 from the substrate chuck 162 to one of the processing stations 124. The substrate 302 can be baked to reduce the amount of a solvent in the planarization layer 1202 and to polymerize further the planarization layer 1202. Alternatively, the baking operation can be performed for contraction and strain relaxation of the planarization layer 1202. The baking operation is optional and may be performed outside the apparatus 100 or 200.

The process includes returning the substrate to the substrate container at block 982 in FIG. 9. The substrate conveyor 132 manipulates the substrate handler 134 of the substrate conveying station 130 to move the substrate 302 from the processing station 124 to the substrate container 122.

Much of the process has been discussed with respect to the apparatus 200 in FIG. 2 and the dispense and planarization operations with respect to FIG. 3. The processing for the substrates 402 and 502 can have staggered starting times to allow for a higher throughput as compared to performing all processing on the substrate 302 before starting processing on substrate 402 or 502. For example, the processing for the substrate 402 can start after placing the substrate 302 on the substrate chuck 162. The apparatus 100 in FIG. 1 or the dispensing and planarization operations in FIGS. 6 to 8 may be used in place of the apparatus 200 or the dispensing and planarization operations in FIGS. 3 to 5. After reading this specification, skilled artisans will be able to design an apparatus and a process flow to meet the needs or desires for a particular application consistent with the teachings as disclosed herein.

The planarization process can be integrated as part of a manufacturing process of making an article. The article can be an electric circuit element, an optical element, a microelectromechanical system (MEMS), a recording element, a sensor, a mold, or the like. An example of the electric circuit element is a semiconductor memories, such as a dynamic random access memory (DRAM), a static random access memory (SRAM), a flash memory, and a magnetoresistive memory (MRAM), a microprocessor, a microcontroller, a graphics processing unit, a digital signal processor, a field programmable gate array (FPGA) or a semiconductor element, a power transistor, a charge coupled-device (CCD), an image sensor, or the like. During manufacturing, a patterned masking layer is used to selectively etch or dope a substrate or a layer overlying the substrate.

The description below is directed to selectively patterning a layer overlying a substrate as illustrated in FIGS. 14 to 19. The apparatuses 100 and 200 can be modified to pattern a layer of formable material. The planarization stations 170 with planarization heads 172 can be patterning stations with patterning heads. The superstrates 174 are replaced by patterned molds. The process associated with FIGS. 14 to 19 are described with respect to the apparatus 200 in FIG. 2 and the dispensing and planarization operations associated with lane 312 of FIG. 3 except the substrate 302 is replaced by a workpiece that includes a substrate 1402 and a layer 1422 overlying the substrate 1402 and the superstrate 174 is replaced by a patterned mold. In other embodiments, the apparatus 100 in FIG. 1 or other lanes as illustrated in FIGS. 4 to 8 can be used.

Figure 14:
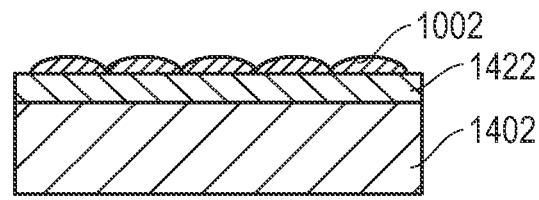
FIG. 14 includes an illustration of a cross-sectional view of a portion of a workpiece including a substrate, a layer, and a formable material.

With respect to FIG. 14, operations in blocks 922 to 944 have been completed. FIG. 14 illustrates the workpiece after the formable material 1002 is dispensed over the layer 1422 that overlies the substrate 1402. In an embodiment, the substrate 1402 can include a monocrystalline semiconductor wafer and may or may not include one or more other layers below the layer 1422. The layer 1422 lies along an exposed surface of the workpiece and can be an insulating layer, a conductive layer, or an epitaxial layer. The layer 1422 has a planar surface that is in contact with the formable material 1002. The planar surface of the layer 1422 can be achieved using a planarization layer, where the planarization layer is formed using any of the apparatuses and techniques previously described.

Figure 15:
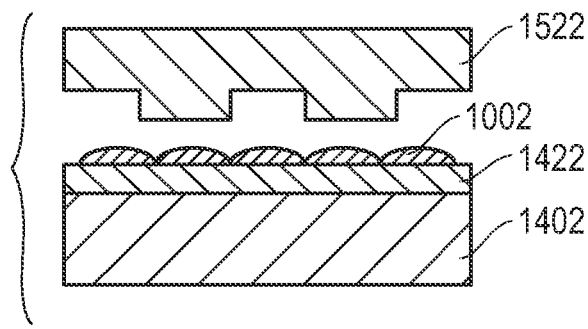
FIG. 15 includes an illustration of a cross-sectional view of the workpiece of FIG. 14 during a patterning operation using a patterned mold.

The process further includes moving the substrate and the substrate chuck to a patterning station. After dispensing the formable material 1002, within lane 312, the substrate stage 164 moves the substrate chuck 162, the substrate 1402, and the layer 1422 are moved to the patterning station, which is near the top of FIG. 3. Within the patterning station, the patterning head includes a mold 1522 that has a patterned contacting surface as illustrated in FIG. 15.

Figure 16:
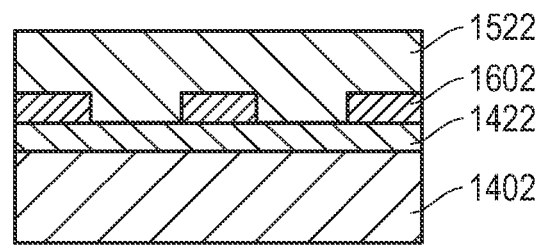
FIG. 16 includes an illustration of a cross-sectional view of the workpiece of FIG. 15 during a patterning operation using the patterned mold to form a patterned layer from the formable material.

The process further includes contacting the formable material 1002 with the mold 1522 while the substrate 1402 is over the substrate chuck 162. FIG. 16 illustrates the mold 1522 contacting the formable material 1002 to form a pattern within the formable material 1002. The formable material 1002 is exposed to actinic radiation to polymerize the formable material 1002 and form a patterned layer 1602.

Similar to the process described with respect to FIGS. 10 to 13, the process associated with FIGS. 14 to 19 does not require a registration operation between dispensing the formable material and pattering the formable material 1002 because the workpiece that includes the substrate 1402 and the layer 1422 remains over the substrate chuck 162 during the dispensing and patterning operations.

Figure 17:
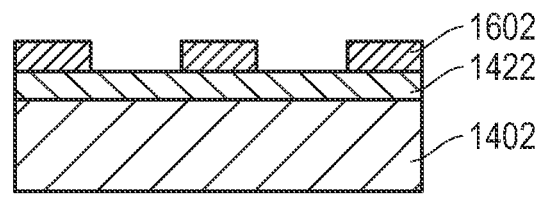
FIG. 17 includes an illustration of a cross-sectional view of the workpiece of FIG. 16 after the patterned mold is removed.

The mold 1522 is removed after the imaged layer 1602 is formed as illustrated in FIG. 17. The mold 1522 corresponds to a stepping field and occupies an area that is smaller than an area occupied by the substrate 1402. The mold 1522 is used repeatedly until most or all of the formable material over the layer 1422 is patterned.

The process further includes baking the formable material after patterning. The substrate conveyor 132 manipulates the substrate handler 134 of the substrate conveying station 130 to move the workpiece that includes the substrate 1402 and the patterned layer 1602 from the substrate chuck 162 to one of the processing stations 124. The workpiece can be baked to reduce the amount of a solvent in the patterned layer 1602 and to polymerize further the patterned layer 1602. Alternative, the baking operation can be performed for contraction and strain relaxation of the patterned layer 1602. The baking operation is optional and may be performed outside the apparatus 100 or 200. The patterned layer 1602 is a masking layer that can be used to selectively process the substrate 1402 or the layer 1422.

The process includes returning the substrate to the substrate container. The substrate conveyor 132 manipulates the substrate handler 134 of the substrate conveying station 130 to move the workpiece including the substrate 1402 and the imaged layer 1602 from the processing station 124 to the substrate container 122.

Figure 18:
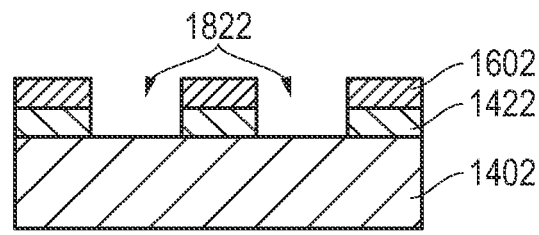
FIG. 18 includes an illustration of a cross-sectional view of the workpiece of FIG. 17 after etching the layer to define openings extending through the layer.
Figure 19:
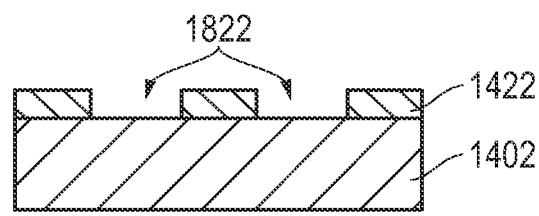
FIG. 19 includes an illustration of a cross-sectional view of the workpiece of FIG. 18 after removing the patterned layer of formable material.

The substrate container 122 with the workpiece is moved from the apparatus 200 to an etching tool (not illustrated). In the embodiment, as illustrated in FIG. 18, the layer 1422 is etched to define openings 1822 that extend to the substrate 1402. The etching is performed using the etching tool. After the openings 1822 are defined, the patterned layer 1602 is removed as illustrated in FIG. 19. Further processing operations are performed to complete the making of the article.

Embodiments described above provide benefits to users of the apparatus. As little as one registration operation may be performed within the apparatus. Fewer actions can be performed when forming a planarization layer from a formable material. Fewer actions allow the apparatus to have higher throughput capacity, substrates can be processed through the apparatus more quickly, and yield will be higher due to less handling of the substrates. The design of the apparatus allows significantly less area to be occupied by the apparatus as compared to a conventional apparatus. Different layouts can be used with the apparatus to allow a user to configure the apparatus to the needs or desires for a particular application.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An apparatus, comprising:
a first substrate chuck configured to hold a first substrate;
a second substrate chuck configured to hold a second substrate;
a dispenser configured to dispense a formable material onto the first substrate while the first substrate overlies the first substrate chuck and to dispense the formable material onto the second substrate while the second substrate overlies the second substrate chuck; and
a dispenser conveyor coupled to the dispenser, wherein;
the first substrate chuck is configured to move along a first axis,
the second substrate chuck is configured to move a second axis, and
the dispenser conveyor is configured to move the dispenser along a third axis that is different from each of the first axis and the second axis.

2. The apparatus of claim 1, further comprising:
a first planarization head configured to planarize the formable material on the first substrate while the first substrate overlies the first substrate chuck; and
a second planarization head configured to planarize the formable material on the second substrate while the second substrate overlies the second substrate chuck.

3. The apparatus of claim 2, further comprising a load station, wherein:
the dispenser is part of a dispensing station, and
from a top view, the dispensing station is disposed between the loading station and the first planarization head.

4. The apparatus of claim 2, wherein:
the dispenser is part of a dispensing station, and
from a top view, the first planarization head is disposed between a loading station and the dispensing station.

5. The apparatus of claim 1, further comprising:
a first substrate stage coupled to the first substrate chuck, wherein the first substrate stage is configured to move the first substrate from a first substrate position to a second substrate position; and
a second substrate stage coupled to the second substrate chuck, wherein the second substrate stage is configured to move the second substrate from a third substrate position to a fourth substrate position.

6. The apparatus of claim 1, wherein the third axis is within 1 degree of being orthogonal to the first axis or the second axis.

7. The apparatus of claim 1, wherein the first substrate chuck is configured to move during dispensing, and the dispenser is configured to remain stationary during dispensing.

8. The apparatus of claim 1, wherein the first substrate chuck is configured to remain stationary during dispensing, and the dispenser is configured to move during dispensing.

9. The apparatus of claim 5, wherein the dispenser has a length and a width, where the length is greater than the width, and the length is oriented along a fourth axis.

10. The apparatus of claim 9, wherein the fourth axis is within 1 degree of being orthogonal to the first axis or the second axis.

11. The apparatus of claim 9, where the fourth axis is within 1 degree of being parallel to the first axis or the second axis.

12. The apparatus of claim 1, wherein the dispenser comprises a plurality of dispensing heads.

13. The apparatus of claim 1, further comprising a substrate conveyor configured to:
- move the first substrate over the first substrate chuck and remove the first substrate from the first substrate chuck, and
- move the second substrate over the second substrate chuck and remove the second substrate from the second substrate chuck.

14. A method, comprising:
placing a first substrate on a first substrate chuck, wherein an apparatus comprises:
- the first substrate chock configured to hold the first substrate;
- a second substrate chuck configured to hold a second substrate;
- a dispenser configured to dispense a formable material onto the first substrate while the first substrate overlies the first substrate chuck and to dispense the formable mater onto the second substrate while the second substrate overlies the second substrate chock; and
- a dispenser conveyor coupled to the dispenser wherein:
  - the first substrate chuck is configured to move along first axis,
  - the second substrate chuck is configured to move along a second axis, and
  - the dispenser conveyor is configured to move the dispenser along a third axis that is different from each of the first axis and the second axis;

dispensing the formable material onto the first substrate while the first substrate is over the first substrate chuck;
contacting the formable material with a first superstrate while the formable material is on the first substrate, and the first substrate is over the first substrate chuck;
curing the formable material over the first substrate to form a first planarization layer;
placing the second substrate on the second substrate chuck;
dispensing the formable material onto the second substrate while the second substrate is over the second substrate chuck;
contacting the formable material with a second superstrate while the formable material is on the second substrate, and the second substrate is over the second substrate chuck; and
curing the formable material over the second substrate to form a second planarization layer,
wherein dispensing the formable material onto the first substrate and dispensing the formable material onto the second substrate are performed using a same dispenser.

15. The method of claim 14, further comprising:
moving the first substrate along the first axis from a first dispensing station to a first planarization station;
moving the second substrate along the second axis from a second dispensing station to a second planarization station; and
moving the dispenser along the third axis from the first dispensing station to the second dispensing station.

16. The method of claim 15, wherein the third axis is within 1 degree of being orthogonal to the first axis or the second axis.

17. The method of claim 14, wherein:
curing the formable material over the first substrate comprises exposing the formable material to an actinic radiation while the formable material is in contact with the first substrate and the first superstrate, and the first substrate is over the first substrate chuck, and
the method further comprises separating the first superstrate from the formable material after exposing the formable material to the actinic radiation.

18. The method of claim 14, wherein, during dispensing the formable material over the first substrate:
the first substrate moves, and the dispenser remains stationary, or
the dispenser moves, and the first substrate remains stationary.

19. A method of making an article, comprising:
forming the first planarization layer over the first substrate by using the method of claim 14; and
processing the first substrate to complete formation of the article.

* * * * *